United States Patent [19]

Reichardt et al.

[11] Patent Number: 4,735,578
[45] Date of Patent: Apr. 5, 1988

[54] CONTACTING APPARATUS FOR A CHIP CARD

[75] Inventors: Manfred Reichardt, Weinsberg; Hans G. Hübner, Heilbronn-Sontheim, both of Fed. Rep. of Germany

[73] Assignee: Amphenol Corporation, Wallingford, Conn.

[21] Appl. No.: 7,831

[22] Filed: Jan. 28, 1987

[30] Foreign Application Priority Data

Jan. 29, 1986 [DE] Fed. Rep. of Germany ....... 3602668

[51] Int. Cl.⁴ .......................................... H01R 13/62
[52] U.S. Cl. .................................. 439/152; 439/260; 439/267
[58] Field of Search ............. 339/45 M, 75 M, 75 MP; 439/260, 267, 152

[56] References Cited

U.S. PATENT DOCUMENTS

| 4,426,122 | 1/1984 | Lainez et al. | 339/75 M |
| 4,443,049 | 4/1984 | DePommery et al. | 339/75 MP |
| 4,449,775 | 5/1984 | DePommery et al. | 339/75 MP |
| 4,466,680 | 8/1984 | Sakai | 339/45 M |
| 4,468,075 | 8/1984 | Tamura et al. | 339/75 M |
| 4,498,047 | 2/1985 | Hexamer et al. | 339/45 M |
| 4,522,456 | 6/1985 | Wehrmacher | 339/75 MP |

FOREIGN PATENT DOCUMENTS

| 2943864 | 5/1980 | Fed. Rep. of Germany . |
| 2933191 | 12/1980 | Fed. Rep. of Germany . |
| 3235654 | 3/1984 | Fed. Rep. of Germany . |
| 3145705 | 9/1984 | Fed. Rep. of Germany . |
| 3433316 | 4/1985 | Fed. Rep. of Germany . |
| 3412453 | 10/1985 | Fed. Rep. of Germany . |
| 2952442 | 3/1986 | Fed. Rep. of Germany . |
| 2021334 | 11/1979 | United Kingdom | 339/75 MP |

Primary Examiner—John McQuade
Attorney, Agent, or Firm—Bacon & Thomas

[57] ABSTRACT

This invention provides for a contacting apparatus for a chip card (302) using an interchangeable set (309) of contact elements. The set of contact elements is preferably designed for the insulation displacement technique. A card support means (308) is provided for receiving the card, which is moved between its operable positions in a manner of a push-button pen. The set of contact elements may include elements (367, 368) which form a switch (421).

24 Claims, 9 Drawing Sheets

4,735,578

CONTACTING APPARATUS FOR A CHIP CARD

BACKGROUND OF THE INVENTION

1. Field of the Invention

This invention relates to a contacting apparatus for a chip card.

2. Description of the Prior Art

Chip cards and contacting apparatus therefore are already known, as shown, for example, in German Patent Application No. 29 52 442. Typically, the contacting apparatus is incorporated in any kind of appropriate device, generally speaking into a peripheral data apparatus, for instance in a telephone or an automatic bank terminal.

The known contacting apparatus has a disadvantage insofar as the contact elements of the contacting apparatus are subjected to wear, as a result of which the proper functioning of the apparatus is lost. Another disadvantage of known contacting apparatus is caused by the fact that a relatively large amount of space is required in the insertion direction of the card. This space requirement causes difficulties for the designer whose task it is to fit the contacting apparatus into a device in which the contacting apparatus is to function. Because of the space requirement, not enough free room is left for the design of the insert opening for the card in the device in which the contacting apparatus is to be used. Also, for the known contacting apparatus, the termination of a cable at the contacting elements is relatively complicated. A still further disadvantage of existing contacting apparatus is due to the fact that frequently a relative movement between the card and the contact elements occurs when the card is inserted into the contacting apparatus. This relative movement may damage the card.

It would be desirable to provide a contacting apparatus which overcomes the above disadvantages.

SUMMARY OF THE INVENTION

In accordance with this invention, there is provided a contacting apparatus for a chip card, the apparatus comprising a housing, a chip card support means reciprocally mounted within the housing for movement between an insert position, a reading position and an output position when pressure is applied against the card in a direction of card insertion, spring means biasing the card support means into its card insert/output position, guide means for guiding the card supporting means in its insert/output position and also in its reading position, detent means for locking the card support means in its insert/output position and also in its reading position, wherein the movement of the card support means from said insert position into the reading position is caused by applying a pushing force to the card such that after reaching abutment means and after the subsequent release of the card, the card support means reaches the card reading position, and wherein for movement from the reading position to the output position, a short pushing force is applied to the card in the inserting direction until the card reaches an abutment means, whereupon after release of the card, the card support means is moved by the spring means into the card output position, and a set of contact elements interchangeably located in the card support means.

A contacting apparatus for a chip card is thus provided such that due to an appropriate design of card support means and the concentration of the contact elements as a separate component in the form of a set of contact elements, the simple exchange of all contact elements may be achieved if they are damaged.

This invention also provides a contacting apparatus in which an end position switch is closed if the card is in its end position in the contacting apparatus. The end position switch provides the information about the end position for further processing by the device in which the contacting apparatus is used. The device may be designed such that after closing of the end position switch, the processing of the information coming from or flowing to the chip card is started.

The contacting apparatus of this invention also provides for a safe guidance of the card during the entire movement of the card within the contacting apparatus.

This invention further provides for a contacting apparatus in which detent means which are arranged such that the contact apparatus requires only a small length in the insertion direction.

The detent means provided in accordance with the invention make it possible that the card can be easily moved from an insert position into a detent or reading position and back to the insert position which is also the output position. This movement is simply caused by pressing in the insert direction against the back edge of the card.

The set of contact elements of this invention is designed for insulation displacement termination. This allows a simple and quick exchange of the set of the contact elements.

DESCRIPTION OF THE PREFERRED EMBODIMENTS

Figure 10:
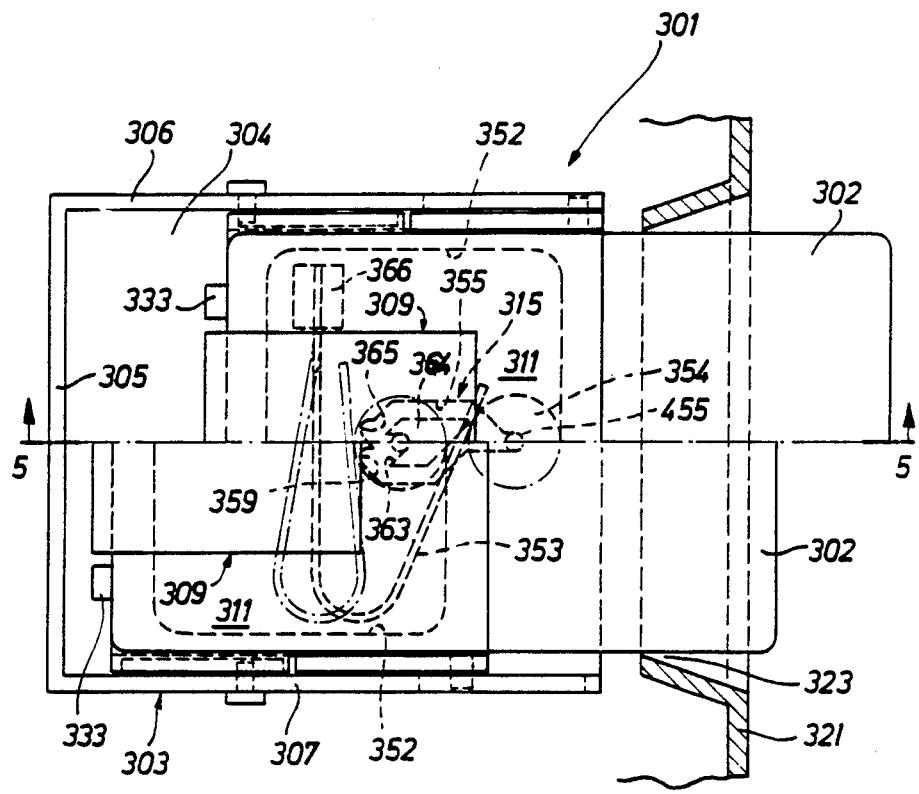
FIG. 10 is a schematic plan view onto the housing of the contacting apparatus, wherein the upper portion of the drawing shows the chip card in the card insert position while the lower portion shows the card in the card reading or contact position.
Figure 11:
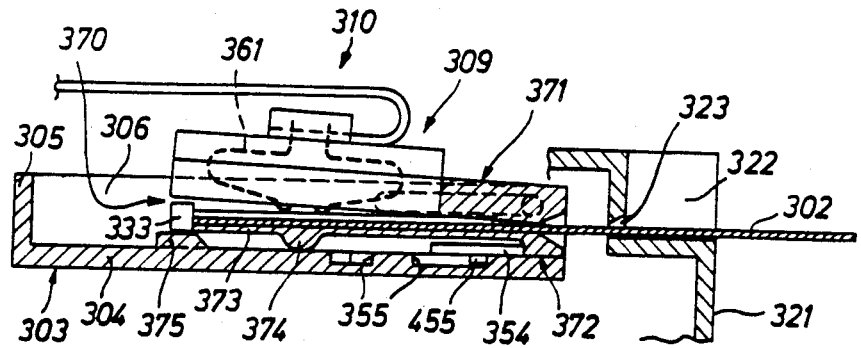
FIG. 11 is a sectional view similar to FIG. 5 of a second embodiment of a contacting apparatus in its card insert/output position.
Figure 12:
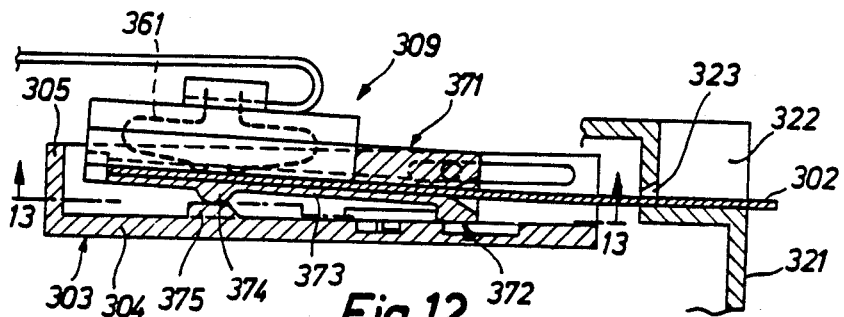
FIG. 12 is a sectional view similar to FIG. 11, with the second embodiment being shown in the card contact or card reading position.
Figure 13:
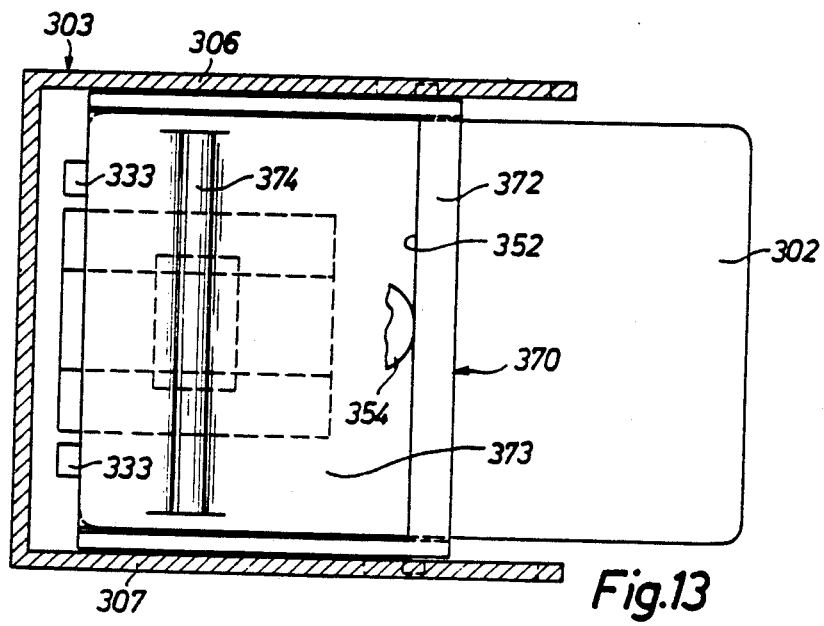
FIG. 13 is a schematic sectional view along line 13—13 in FIG. 12.

The following is a short overview of the disclosure. FIGS. 1-10 relate to a first embodiment of a contacting apparatus 301 for a chip card 302. FIGS. 11 through 13 relate to a second embodiment of a contacting apparatus 310 for a chip card 302. FIGS. 14 through 18 disclose a set of contact elements 309 designed for easy exchangeability. The set of contact elements 309 can be used in the first as well as in the second embodiment.

Figure 5:
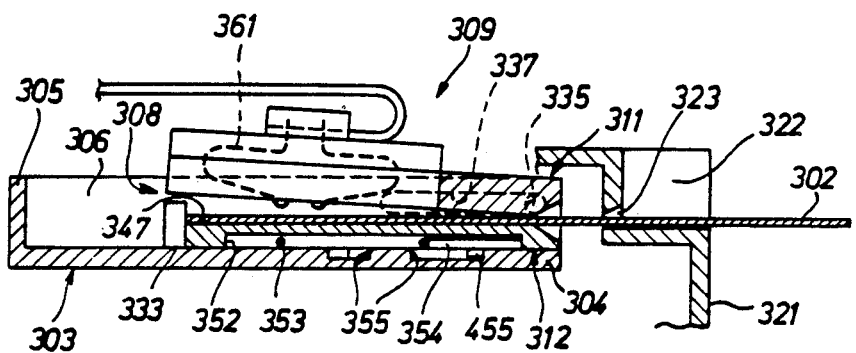
FIG. 5 is a sectional view along line 5—5 in FIG. 1, with the set of contact elements being inserted and the scale being somewhat reduced with respect to the representation of FIG. 1.
Figure 6:
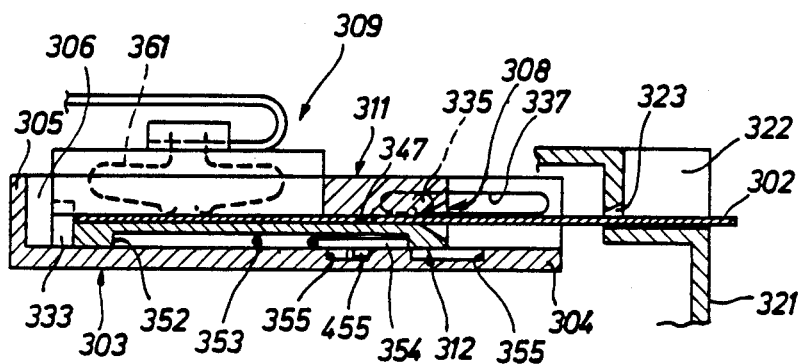
FIG. 6 is a sectional view along line 6—6 in FIG. 3 on a somewhat reduced scale, with the set of contacting elements being inserted into the contacting apparatus.
Figure 7:
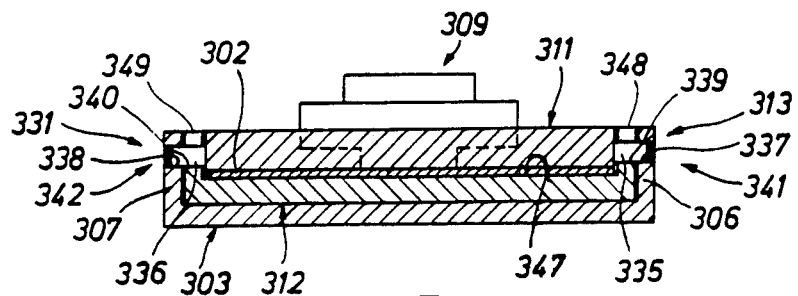
FIG. 7 is a sectional view along line 7—7 in FIG. 1.
Figure 8:
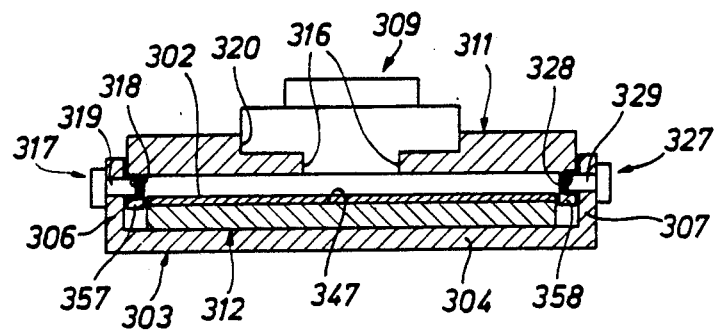
FIG. 8 is a sectional view along line 8—8 in FIG. 1.
Figure 9:
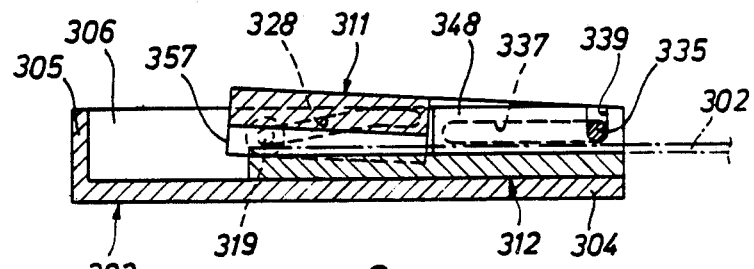
FIG. 9 is a sectional view along line 9—9 in FIG. 1.

The contacting apparatus 301 shown in FIGS. 1-10 comprises a housing 303 which is arranged in any kind of device, for instance a telephone apparatus or an automatic teller machine. Part of the device is shown at 321 in FIGS. 1, 5, 6 and 10. FIG. 6 shows some details of device 321, namely an insert opening 322 and an insert slot 323.

Figure 1:
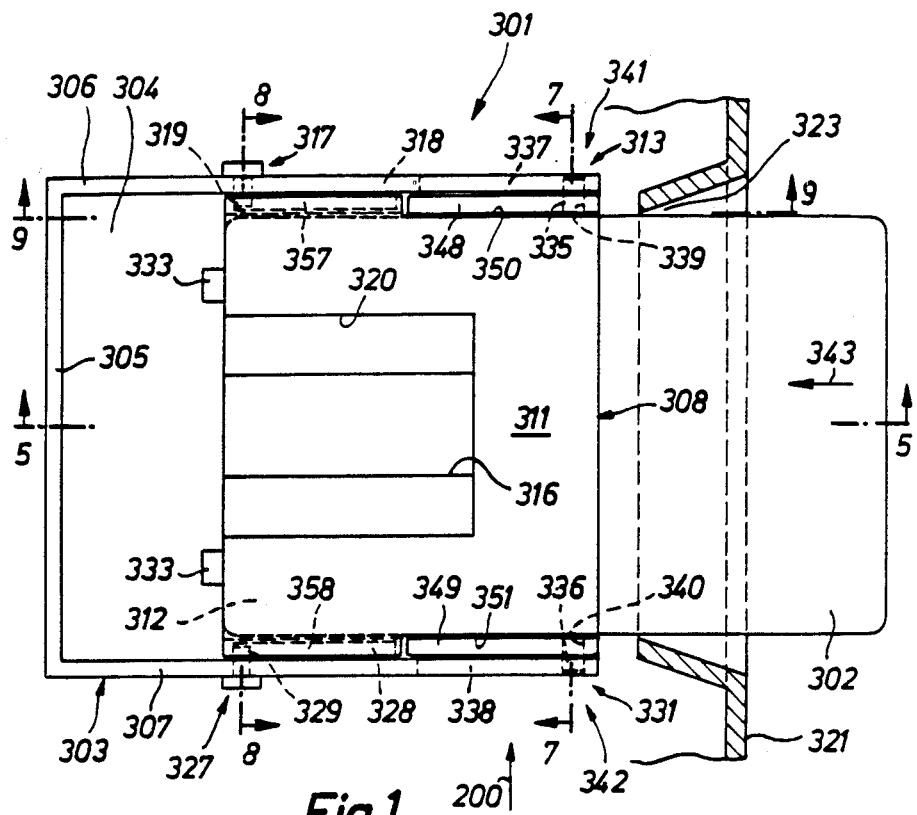
FIG. 1 is a schematic plan view of a contacting apparatus of this invention in the card insert position, with the set of contact elements not being inserted.
Figure 2:
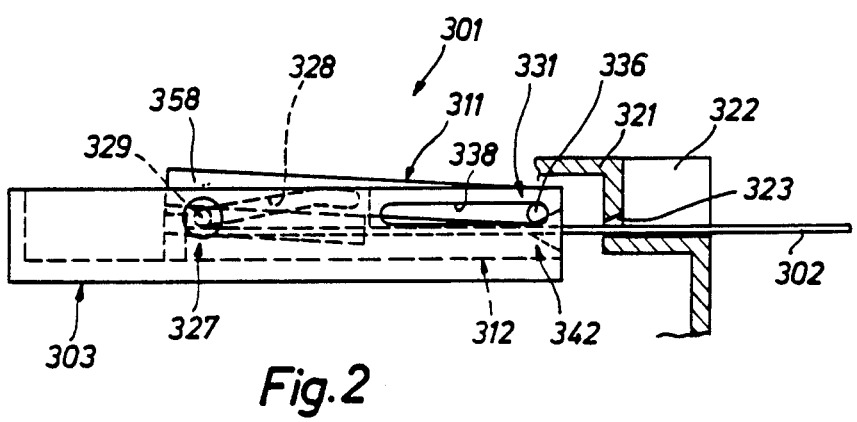
FIG. 2 is a side elevational view of the contacting apparatus of FIG. 1 seen in the direction of arrow 200.
Figure 3:
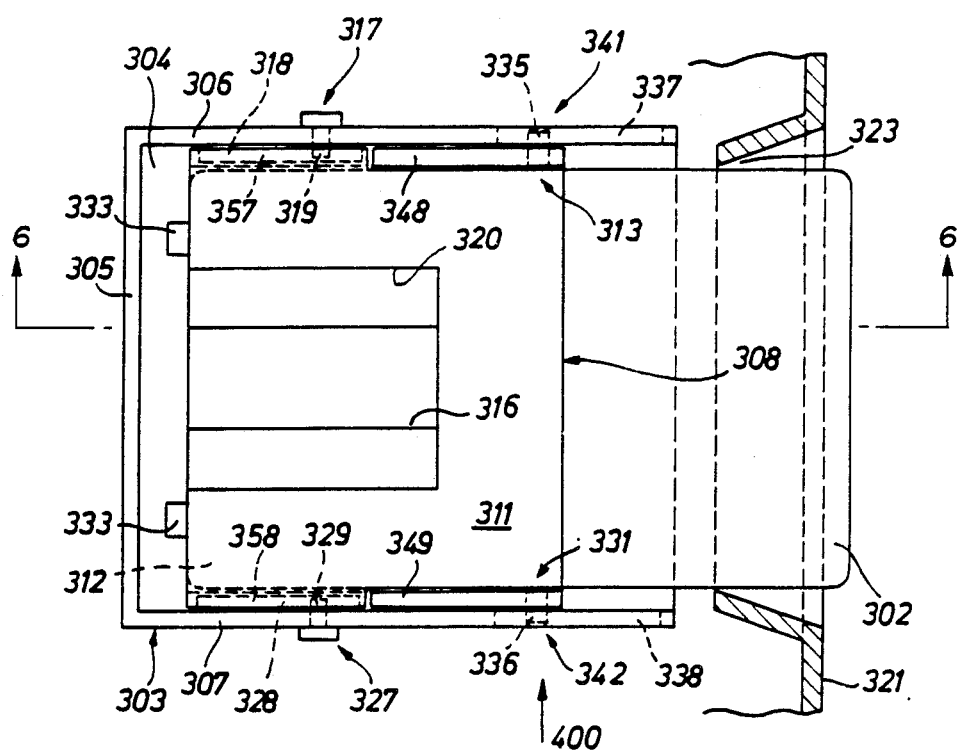
FIG. 3 is a plan view similar to the view of FIG. 1, with the contacting apparatus in the reading or card contacting position.
Figure 4:
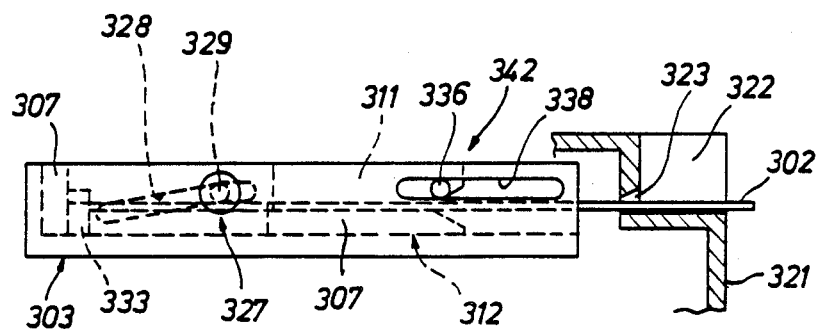
FIG. 4 is a side elevational view of the contacting apparatus of FIG. 3 seen in the direction of arrow 400.

Within housing 303 a card support or guide means 308 is reciprocally mounted. In FIG. 1 card support means 308 is shown in its first position, the card insert position. As will be gathered from the following description, the card insert position is identical to the card output position. FIG. 3 shows the card support means 308 in its second or card reading position. The card reading position is also referred to as the card contact position.

In short, the contacting apparatus 301 of the invention operates in the following manner. Card 302 is moved, practically without encountering any resistance, into card support means 308 shown in FIG. 1 up until a point in time where abutment means (abutments 333 described below) terminate the insert movement without resistance of card 302. Provided that the operator of contacting apparatus 301 will now exert an increased pushing force against card 302, the card will carry card support means 308 along and moves with respect to housing 303 into the card reading position shown in FIG. 3.

During such movement of card support means 308, contact elements 361 (described in detail below and shown for instance in FIG. 5) will be brought into engagement with card 302 at a location where chip termination contacts are provided on the card. (See FIG. 6). Card 302 will then remain together with card support means 308 in the card reading position up until a point in time when the operator again will push in the insert direction against the back edge of card 302 which projects out of the card support means. When pressing against the back edge of card 302 in the reading position, the detent means holding the card support means in the card reading position will be released and card support means 308 will return due to the action of spring means 353 into the card output position (which is identical to the card insert position) shown in FIG. 1. Card 302 can easily be removed from card support means 308 in the card output position.

In accordance with this invention contacting apparatus 301 comprises a first or upper member 311 and a second or bottom member 312. First member 311 is referred to as a contact element support in the following description and the second member is referred to as an ejector. Contact element support 311 and ejector 312 are coupled for common movement between the card insert position and the card reading position. Further, means are provided which will cause a relative pivotal movement between contact element support 311 and ejector 312 in such a manner that the contact element support 311 moves the set 309 of contact elements (see FIGS. 5 to 8) with its contact elements 361 into engagement with chip card 302.

Card support means 308 is guided during its movement between the card insert position and the card reading position by guide means 341, 342. Moreover, pivot means 317, 327 are provided so as to allow for a pivotal movement of contact element support 311 with respect to ejector 312.

Housing 303 has a bottom wall 304. A rear wall 305 and two sidewalls 306 and 307 extend upwardly from bottom wall 304 generally in the form of a horseshoe, i.e., said walls extend out of the plane of drawing of FIG. 1. The upper sidewall in FIG. 1 will be referred to as first sidewall 306 and the lower sidewall referred to as second sidewall 307. Arrow 343 in FIG. 1 refers to the direction of insert (insert direction) for chip card 302. The guidance of card support means 308 during the translatory motion is provided by slots 337 and 338. These slots preferably extend parallel to the upper surface of bottom wall 304. Slots 337 and 338 are arranged adjacent to the input side (to the right in FIG. 1) in first and second side walls 306 and 307, respectively, and extend in the insert direction. Further, pins 319 and 329, respectively, extend through sidewalls 306 and 307, respectively, and are operatively connected with card support means 308.

Contact element support 311 and ejector 312 are pivotally connected by means of pivot bearing means 313 and 331. Each of said pivot bearing means 313 and 331, respectively, comprises a bearing pin 335 and 336, respectively, provided at contact element support 311. Bearing pins 335 and 336 are located in corresponding recesses 339 and 340, respectively, of ejector 312. Further, bearing pins 335 and 336 extend into the appropriate slots 337 and 338, respectively, and contribute to the formation of guide means 341 and 342.

Ejector 312 includes a bottom wall 347 with abutment means 333 projecting upwardly (see FIGS. 5 and 6) from bottom wall 347. Adjacent to sidewalls 306 and 307, respectively, guide walls 348 and 349, respectively, extend upwardly with respect to bottom wall 347.

It should be noted that recesses 339 and 340 already mentioned are provided in guide walls 348 and 349, respectively. Guide walls 348 and 349 extend approximately one half the length of card support means 308 in the insert direction starting from the side where card 302 is inserted.

Contact element support 311 forms guide walls 357 and 358, respectively, which are in alignment with and adjacent to guide walls 348 and 349, respectively. For all practical purposes, guide walls 348 and 349, respectively, are located in recesses 350 and 351, respectively, of contact element support 311. In accordance with this invention, card 302 is laterally guided in the frontal or insert area by means of ejector 312 and in the rear area of the insert direction by contact element support 311.

So as to cause a pivotal movement of contact element support 311 towards ejector 312 when the card support means is moved from the card insert position into the card reading position, pins 319 and 329 extend into guide slots 318 and 328 provided in guide walls 357 and 358 such that the desired pivotal movement is automatically effected due to the movement of card support means 308 in the direction of arrow 343. As is shown in FIGS. 5, 6 and 10, the bottom surface of bottom wall 347 is provided with a recess 352 such that a spring 353 and a guide disk 354 can be housed within recess 352. Guide disk 354 is centrally provided with a pin 455 which projects into a heart-shaped groove (guide recess) 355 provided in the upper surface of bottom wall 304. A detent mechanism 315 adapted to maintain card support means 308 in its reading position will be described below when referring to FIG. 10.

It should be noted that contact element support 311 includes a contact set recess 320 adapted to receive a set 309 of contact elements. Recess 320 includes a slot 316 so as to provide access for contact elements 361 to the contacts of chip card 302.

Detent mechanism 315 shown in FIGS. 5, 6 and 10 allows a movement for the card support means 308 which is similar to the movement used in a push-button pencil or push-button ballpoint pen. This means that the movement of card support means 308 occurs against the force of spring means (spring 353) out of the card insert position in the direction of arrow 343. The card insert position is shown in FIG. 10 in the upper half of the drawing. The bottom half of FIG. 10 represents the card reading position. During the above-mentioned movement from the card insert position into the card reading position, card receiving means 308 is initially guided by guide recess 355 beyond the card reading position up until guide pin 356 contacts guide member 359 of guide recess 355, and falls then back into a detent recess 363 of a guide member 364. This position defines the card reading position. The movement of guide pin 354 out of detent recess 363, and consequently the movement of card support means 308 from the reading or detent position into the card insert/output position, is initiated when pressing against the edge of the card which extends opposite to insert direction 343. When an operator presses against the card edge, pin 455 will leave detent recess 363 and is guided by an oppositely located guide nose into a guide member 365, from where pin 455 will move together with guide disk 354 along a guide path of guide recess 355 back into the position shown in the right part of FIG. 10. This movement back occurs in opposite direction to the movement from the insert position towards guide member 359.

During this movement ejector 312 is carried along by means of guide disk 354. The movement from guide member 365 back into the insert position is caused by spring 353. As is shown at 366, spring 353 is mounted in recess 352 of ejector 312 in a suitable manner.

FIGS. 11 through 13 disclose a second embodiment of a contacting apparatus 310 of this invention. According to this embodiment, a card support means 370 against comprises a contact element support 371 and an ejector 372. According to this second embodiment, the contact element support and the ejector are of integral design. A part of the bottom of ejector 372 is designed as a spring tongue 373. During the movement of card 302, spring tongue 373 will press card 302 against set 309 of contact elements as soon as a cam 374 formed at the bottom side of the tongue engages a projection 375 of housing bottom 304. In the upper surface of bottom wall 304 of housing 303 as well as in the lower surface of ejector 372, detent means are provided which are similar to the detent means shown in FIG. 10. Therefore, similar reference numerals are used for the embodiment of FIGS. 11 through 13 and because of this similarity, no description of the detent means is necessary.

Figure 14:
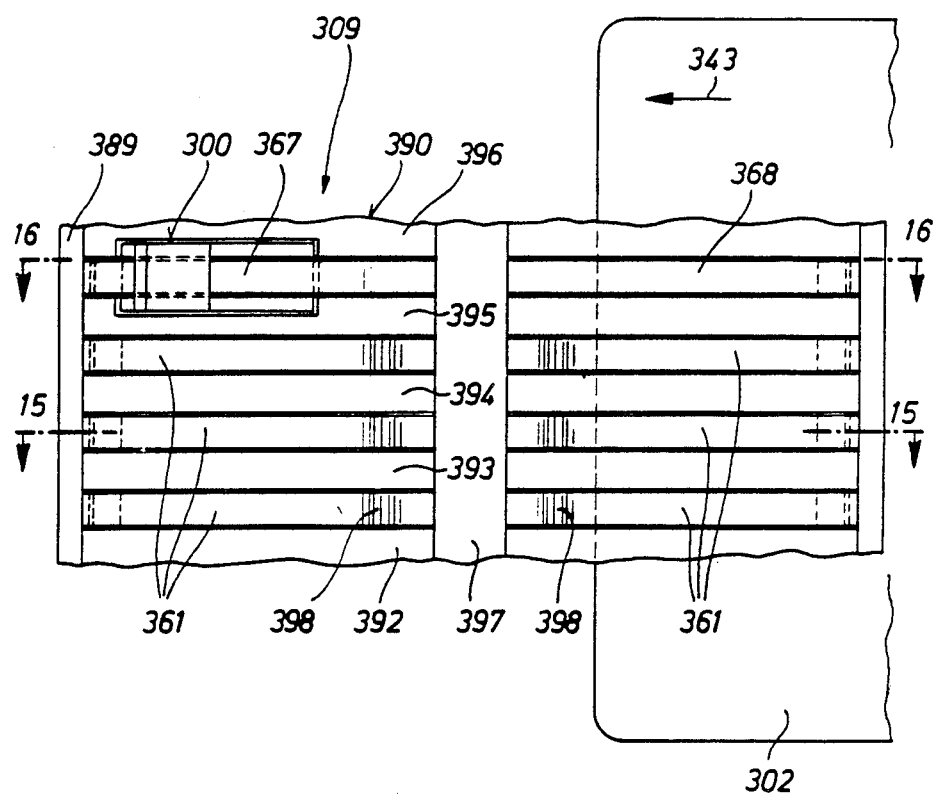
FIG. 14 is a plan view of the contacting side of the set of contact elements.
Figure 15:
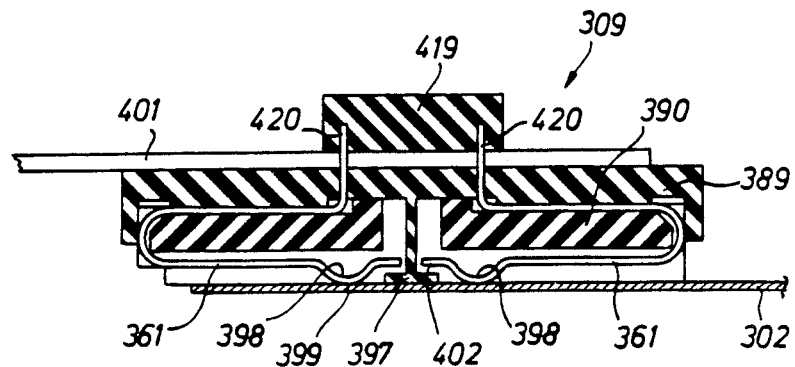
FIG. 15 is a sectional view substantially along line 15—15 in FIG. 14, with the scale being somewhat reduced with respect to FIG. 14.
Figure 16:
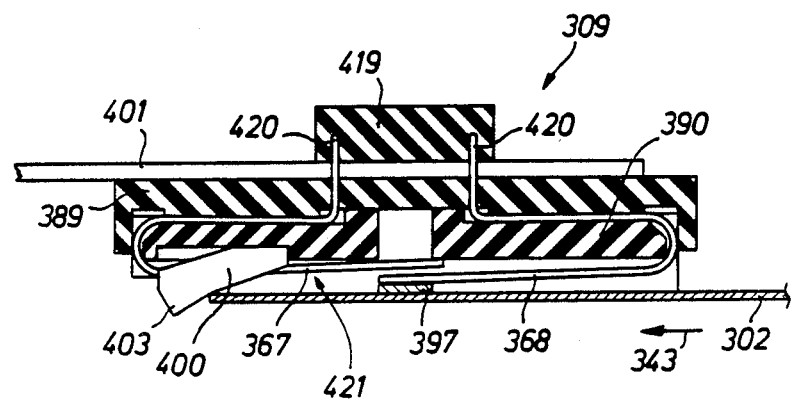
FIG. 16 is a schematic cross-sectional view along line 16—16 in FIG. 14.
Figure 17:
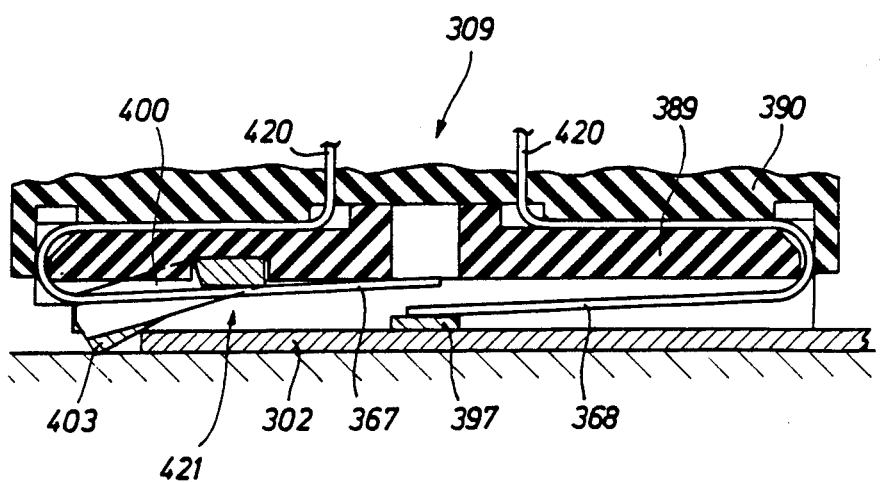
FIG. 17 shows the actuation of the end position switch of FIG. 16 in some detail, with the end position switch being in its rest position.
Figure 18:
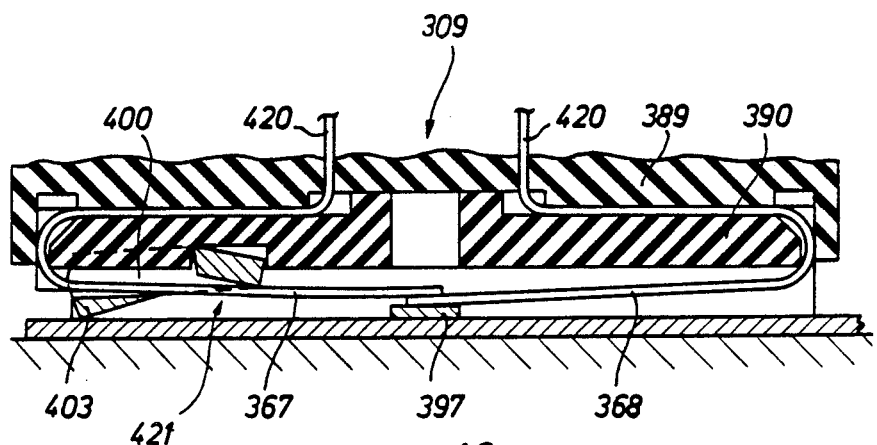
FIG. 18 shows the end position switch of FIG. 16 in some detail in its contacting position.

FIGS. 14 through 16 disclose a set 309 of contact elements. Set 309 of contact elements may be used in connection with the first as well as the second embodiment. In accordance with this invention, set 309 of contact elements is designed to employ the insulation displacement technique.

FIG. 14 shows a bottom plan view of set 309 of contact elements. An insulating body 390 is shown as defining by walls 392 through 396 receiving spaces for contact elements 361. The majority of contact elements 361 have the shape shown in FIG. 15. In FIG. 15 chip card 302 is shown in its reading position where bight portions 398 of contact elements 361 contact termination locations (contacts) 399 on card 302. If contact elements 361 of FIG. 15 are not in contact with contacts 399, they abut with their free ends 402 at a plate 397.

Of the contact elements 361 preferably two oppositely arranged contact elements 367 and 368 are modified such that they form an end position switch 421 together with a switch member 400. End position switch 421 is a switch which indicates the fact that card 302 is located in its end position, i.e., its reading position. The two contact elements 367 and 368 are identical, stamped members having oppositely directed bias. FIG. 16 shows that contact element 367 is biased downwardly. This means that without actuation of switching member 400, no contact engagement occurs between contact elements 367 and 368.

Switching member 400 which can also be called an actuating lever is placed between the insulating body (contact element support) 390 and contact element 367 such that actuating lever 400 closes the end position switch when card 302 is inserted, i.e., contact elements 367 and 368 will be closed. The end position switch will be opened as soon as card 302 is removed from its end position. Actuating lever 400 acts against the bias of contact element 367 and requires no additional spring.

Actuating lever 400 is U-shaped and comprises two legs, each of which ends in abutment noses 403. Card 302 is adapted to abut against abutment noses 403 so as to pivot actuating lever 400 in a clockwise direction (FIG. 16). This pivotal movement occurs, as already mentioned, contrary to the bias of contact element 367. In case that card 302 is pulled out of the contacting apparatus, contact element 367 will push actuating lever 400 again into the position shown in FIG. 16.

Contact elements 361, 367 and 368 end in insulation displacement termination means 420 onto which a flat cable 401 of a plurality of conductors may be pressed by means of a pressure member 419.

A holding member 389 prevents the contact elements from falling out of the insulating body.

It can be seen that the present invention provides a contacting apparatus which overcomes the disadvantages of the prior art. In particular, the contact elements can be easily removed if they are damaged, and an end position switch is provided which signals that the card is in its end position. The card is safely guided during its entire movement within the contacting apparatus. The contacting apparatus is relatively small in the insertion direction.

What is claimed is:

1. A contacting apparatus for a chip card, said apparatus comprising:
   a housing,
   a chip card support means reciprocally mounted within said housing for movement between an insert position, a reading position and an output position when pressure is applied against said card in a direction of card insertion,
   spring means biasing said card support means into its card insert/output position,
   guide means for guiding said card supporting means in its insert/output position and also in its reading position,
   detent means for locking said card support means in its insert/output position and also in its reading position,
   abutment means for said card support means,
   wherein said movement of said card support means from said insert position into said reading position is caused by applying a pushing force to said card such that after reaching said abutment means and after the subsequent release of the card, said card support means reaches said card reading position, and
   wherein for movement from said reading position to said output position, a short pushing force is applied to said card in said inserting direction until said card reaches said abutment means, whereupon after release of said card, said card support means is moved by said spring means into said card output position, and
   a set of contact elements interchangeably located in said card support means.

2. The contacting apparatus of claim 1, characterized in that recess means for said set of contact elements are provided in said card support means.

3. The contacting apparatus of claim 2, characterized in that said set of contact elements comprises a plurality of spring contact elements having insulation displacement contacts for a flat cable.

4. The contacting apparatus of claim 3 characterized in that said set of contact elements comprises an insulating body, said insulating body comprising at one side spring contact elements and at an opposite side contacts for insulation displacement of said cable, wherein said recess means comprises a slot providing access to said chip card.

5. The contacting apparatus as set forth in claim 1, characterized in that said set of contact elements comprises a plurality of contact elements for making contact with contacts on said chip card, and a plurality of modified contact elements in the form of contact springs which form an end position switch for said chip card.

6. A contacting apparatus as set forth in claim 5, characterized in that said contact springs are identical, stamped members which are biased in opposite directions, wherein an actuating lever is inserted between an insulating body carrying said contact elements and one of said modified contact springs such that said actuating lever will close said end position switch when said card is inserted, while the end position switch will automatically open as soon as said card is moved out of its end position, and wherein said actuating lever does not require an additional spring inasmuch as it acts against the bias of said contact spring.

7. The contacting apparatus of claim 1, characterized that a contact element support is provided by said card support means.
   said set of contact elements being interchangeably mounted on said contact element support,
   an ejector provided on said card support means and pivotally mounted on said contact element support,
   a first guide means provided at said ejector for guiding said card in the front region of said card support means, and
   a second guide means provided at said contact element support for guiding said card in said direction of insertion in a rear region of said card support means.

8. The contacting apparatus as set forth in claim 7, characterized in that said contact element support is pivotally mounted at said ejector at a forward location with respect to the direction of insertion.

9. The contacting apparatus of claim 8, characterized in that a third guide means for the reciprocal movement of said card support means is located rearwardly with respect to the direction of insertion.

10. The contacting apparatus as set forth in claim 8, characterized in that first pivot means for the pivotal movement of said contact element support with respect to said ejector is located in forward direction with respect to the direction of insertion.

11. The contacting apparatus as set forth in claim 10, characterized in that second pivot means for providing a pivotal movement between said contact element support and said ejector cooperate with said housing, so as to provide guidance during said reciprocal movement.

12. The contacting apparatus of claim 11, characterized in that said second pivot means comprises at least one pin which extends into a recess of said ejector and ends in a slot of said housing.

13. A contacting apparatus for a chip card, said apparatus comprising:
    a housing,
    a chip card support means reciprocally mounted within said housing for movement between an insert position, a reading position and an output position when pressure is applied against said card in a direction of card insertion,
    spring means biasing said card support means into its card insert/output position,
    guide means for guiding said card supporting means in its insert/output position and also in its reading position,
    detent means for locking said card support means in its insert/output position and also in its reading position,
    abutment means for said card support means,
    wherein said movement of said card support means from said insert position into said reading position is caused by applying a pushing force to said card such that after reaching said abutment means and after the subsequent release of the card, said card support means reaches said card reading position, and
    wherein for movement from said reading position to said output position, a short pushing force is applied to said card in said inserting direction until said card reaches said abutment means, whereupon after release of said card, said card support means is moved by said spring means into said card output position, and wherein said spring means is located in a recess in the bottom of said card support means, and a set of contact elements interchangeably located in said card support means.

14. The contacting apparatus of claim 13, characterized in that said card support means comprises a contact element support with an ejector being located therebelow, said spring means being located in a lower surface of said ejector.

15. The contacting apparatus of claim 14, characterized in that said spring means comprises a flat U-shaped wire spring.

16. The contacting apparatus as set forth in claim 15, characterized in that said spring is mounted with one end at said housing and transmits its force via a guide disk onto said ejector, so as to bias the same into its insert/output position.

17. The contacting apparatus as set forth in claim 1, characterized in that said detent means is provided in the upper surface of the bottom of the housing.

18. The contacting apparatus as set forth in claim 17, characterized in that said detent means comprises in the upper surface of the bottom of said housing a heart-shaped groove, said spring means being mounted so as to transmit its force via a guide disk onto an ejector provided on said card support element, said disk being adapted to follow said heart-shaped groove when said card is actuated.

19. The contacting apparatus as set forth in claim 18, characterized in that a guide pin is mounted at said guide disk and extends into said groove.

20. The contacting apparatus as set forth in claim 13, characterized in that said set of contact elements is designed for the insulation displacement technique.

21. The contacting apparatus of claim 20, characterized in that contact elements of said set of contact elements end in insulation displacement contacts onto which a flat cable can be pressed by means of a pressure member.

22. The contacting apparatus as set forth in claim 1, characterized by that said card support means comprises a contact element support and an ejector, said contact element support and said ejector being of integral design.

23. The contacting apparatus as set forth in claim 22, characterized in that a part of the bottom of said ejector is designed as a spring tongue, said card pressing against said set of contact elements from below during the insertion movement of said card, as soon as a cam provided at the bottom side of said tongue moves on a projection provided in the housing bottom.

24. The contacting apparatus of claim 1, characterized by said card support means comprises a contact element support and an ejector, that part of the bottom of said ejector is designed as a spring tongue, said card pressing against said set of contact elements from below during the insertion movement of said card, as soon as a cam provided at the bottom side of said tongue moves on a projection provided in the housing bottom.

* * * * *